US012288713B2

United States Patent
Sasaki et al.

(10) Patent No.: US 12,288,713 B2
(45) Date of Patent: Apr. 29, 2025

(54) MOUNTING TABLE AND PLASMA PROCESSING APPARATUS

(71) Applicant: TOKYO ELECTRON LIMITED, Tokyo (JP)

(72) Inventors: Yasuharu Sasaki, Miyagi (JP); Daiki Satoh, Miyagi (JP); Akira Nagayama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 657 days.

(21) Appl. No.: 17/107,678

(22) Filed: Nov. 30, 2020

(65) Prior Publication Data

US 2021/0082733 A1 Mar. 18, 2021

Related U.S. Application Data

(63) Continuation of application No. 15/718,126, filed on Sep. 28, 2017, now abandoned.

(30) Foreign Application Priority Data

Sep. 29, 2016 (JP) ................. 2016-191707

(51) Int. Cl.
*H01L 21/683* (2006.01)
*H01J 37/32* (2006.01)
(Continued)

(52) U.S. Cl.
CPC ...... *H01L 21/6833* (2013.01); *H01J 37/3244* (2013.01); *H01J 37/32715* (2013.01);
(Continued)

(58) Field of Classification Search
CPC .......... C23C 16/466; H01L 21/68742
See application file for complete search history.

(56) References Cited

U.S. PATENT DOCUMENTS 5,720,818 A * 2/1998 Donde ................ C23C 16/4586
                                                    118/728
5,730,803 A * 3/1998 Steger ................ C23C 16/4586
                                                    118/724
(Continued)

FOREIGN PATENT DOCUMENTS

JP        2004031665 A   *  1/2004
JP        2004-253768 A     9/2004
(Continued)

OTHER PUBLICATIONS

English Machine translation of Hong (KR100734671B1) retrieved from ESPACENET May 2, 2023 (Year: 2023).*
(Continued)

*Primary Examiner* — Ram N Kackar
*Assistant Examiner* — Laureen Chan
(74) *Attorney, Agent, or Firm* — XSENSUS LLP

(57) ABSTRACT

A mounting table, to which a voltage is applied, includes an electrostatic chuck having a mounting surface for mounting a target object and a rear surface opposite to the mounting surface, the electrostatic chuck having a first through-hole formed in the mounting surface; a base, which is in contact with the rear surface of the electrostatic chuck, having a second through-hole communicating with the first through-hole; a cylindrical spacer inserted in the second through-hole; and a pin accommodated in the first through-hole and the spacer. Gaps are formed between the pin and inner walls of the first through-hole and the spacer, and the gap between the first through-hole and the pin is greater than the gap between the spacer and the pin.

14 Claims, 8 Drawing Sheets

(51) Int. Cl.
  *H01L 21/67* (2006.01)
  *H01L 21/687* (2006.01)
(52) U.S. Cl.
  CPC .. *H01L 21/67069* (2013.01); *H01L 21/67103* (2013.01); *H01L 21/67109* (2013.01); *H01L 21/6831* (2013.01); *H01L 21/68742* (2013.01); *H01J 2237/334* (2013.01)

(56) References Cited

U.S. PATENT DOCUMENTS

| | | | | |
|---|---|---|---|---|
| 2006/0175772 A1* | 8/2006 | Nozawa | ............. | H01L 21/6833 156/280 |
| 2008/0230181 A1* | 9/2008 | Higuma | ............. | C23C 16/4581 118/728 |
| 2012/0006492 A1* | 1/2012 | Kikuchi | ............. | H01J 37/3244 156/345.51 |
| 2013/0128397 A1* | 5/2013 | Sato | ................... | H01L 21/6831 361/54 |
| 2014/0202635 A1* | 7/2014 | Yamaguchi | ......... | H01L 21/6831 279/128 |

FOREIGN PATENT DOCUMENTS

| | | | | |
|---|---|---|---|---|
| JP | 2002-134489 A | | 5/2005 | |
| JP | 2006-128205 A | | 5/2006 | |
| JP | 2008-235430 A | | 10/2008 | |
| JP | 3154629 U | | 10/2009 | |
| JP | 2014-143244 A | | 8/2014 | |
| JP | 2016143760 A | * | 8/2016 | |
| KR | 20070036270 A | * | 4/2007 | ........ H01J 37/32715 |
| KR | 100734671 B1 | * | 7/2007 | |
| KR | 100994463 B1 | * | 11/2010 | ........ H01J 37/32082 |
| KR | 101022663 B1 | * | 3/2011 | |
| WO | 2004/084298 A1 | | 9/2004 | |

OTHER PUBLICATIONS

English Machine Translation of Morita (JP-2004031665-A) retrieved from ESPACENET May 3, 2023 (Year: 2023).*
English Machine Translation of Jeon (KR101022663B1) retrieved from ESPACENET May 2, 2023 (Year: 2023).*
English Machine Translation of Lee et al. KR20070036270A retrieved from ESPACENET May 30, 2024 (Year: 2024).*
English Machine Translation of Kim (KR100994463B1) retrieved from ESPACENET Jun. 1, 2024 (Year: 2024).*

* cited by examiner

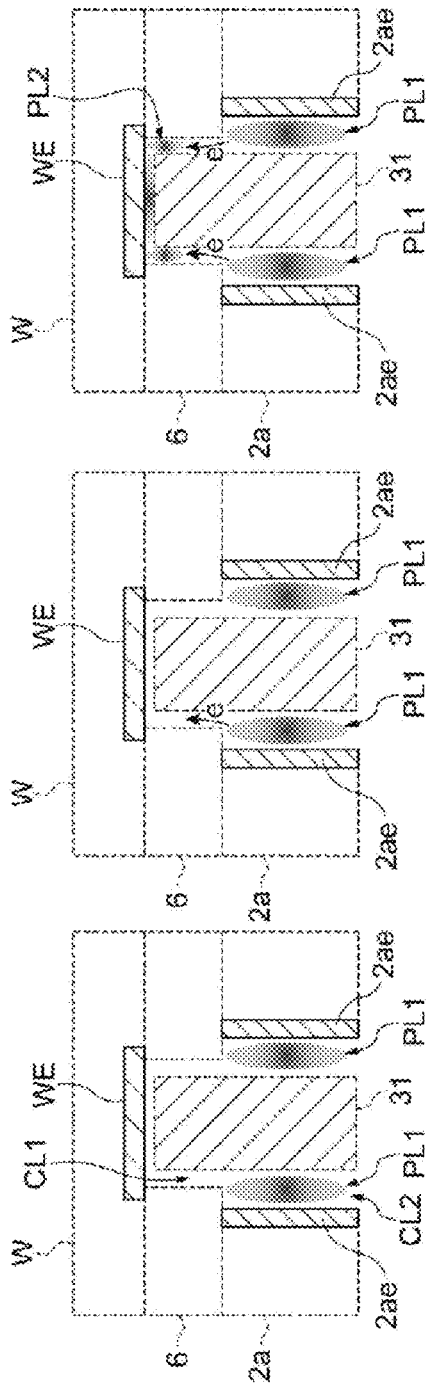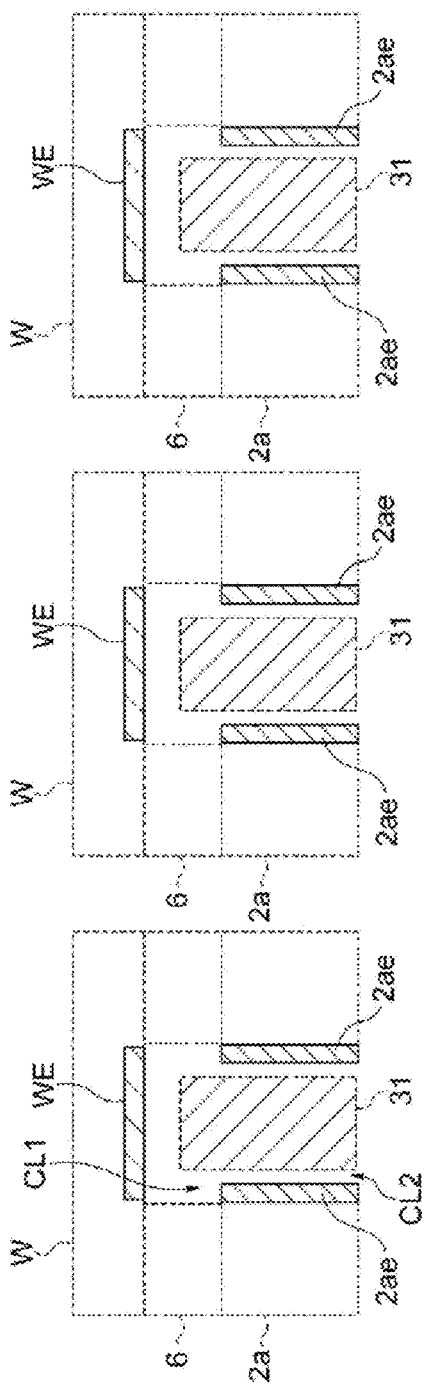

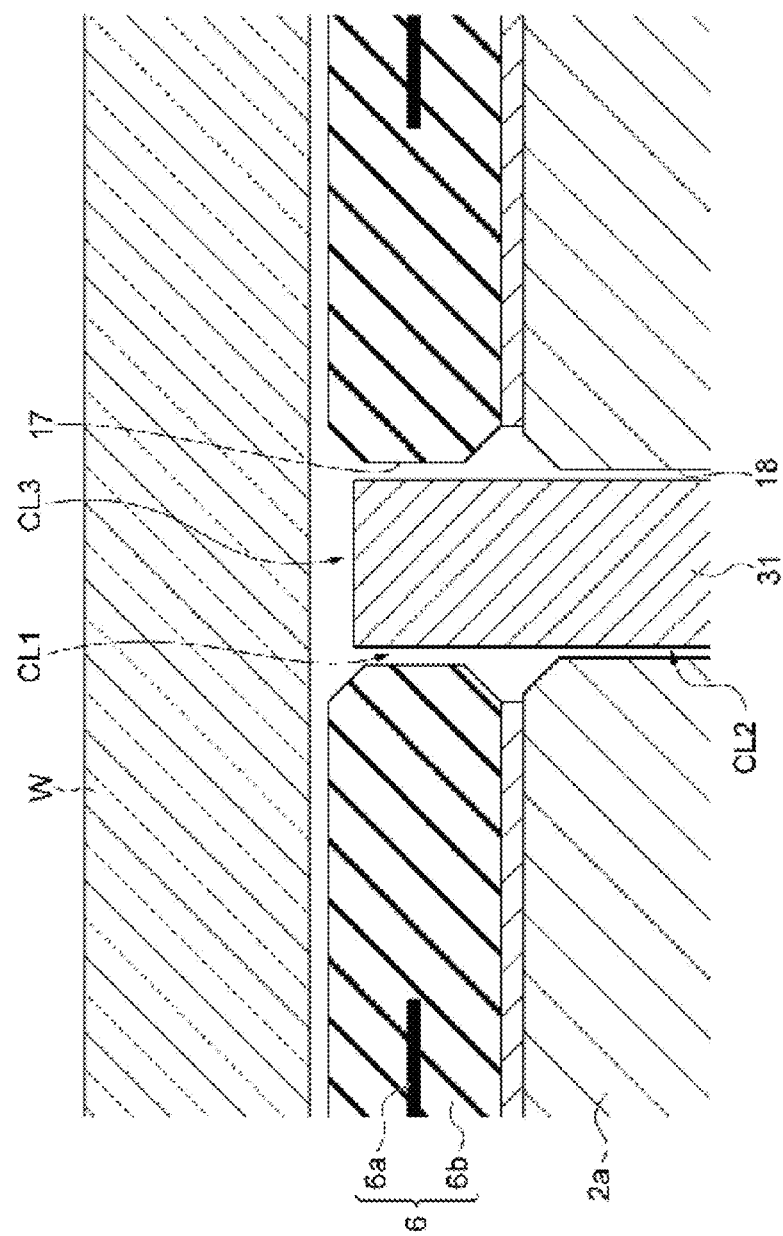

FIG. 8

| | GAP CL1(mm) | GAP CL2(mm) | DISCHARGE OCCURRENCE | DISTANCE BETWEEN TOP SURFACE OF PIN AND BACKSIDE OF WAFER |
|---|---|---|---|---|
| TEST EXAMPLE 1 | 0.15 | 0.05 | NO | 0.2mm |
| TEST EXAMPLE 2 | 0.15 | 0.05 | NO | 0.3mm |
| COMPARATIVE EXAMPLE | 0.035 | 0.2 | YES | ≈0mm |

MOUNTING TABLE AND PLASMA PROCESSING APPARATUS

CROSS-REFERENCE TO RELATED APPLICATIONS

This application is a continuation of U.S. patent application Ser. No. 15/718,126, filed on Sep. 28, 2017, which claims priority to Japanese Patent Application No. 2016-191707 filed on Sep. 29, 2016, the entire contents of which are incorporated herein by reference.

FIELD OF THE INVENTION

The disclosure relates to a mounting table and a plasma processing apparatus.

BACKGROUND OF THE INVENTION

Japanese Patent Application Publication No. 2014-143244 discloses therein a plasma processing apparatus including a processing chamber capable of defining a vacuum space, a mounting table which mounts thereon a target object and serves as a lower electrode in the processing chamber, and an upper electrode provided to face the mounting table. In the plasma processing apparatus disclosed in Japanese Patent Application Publication No. 2014-143244, plasma processing is performed on the target object such as a wafer or the like which is mounted on the mounting table by applying a high frequency power between the mounting table serving as the lower electrode and the upper electrode.

Further, the plasma processing apparatus disclosed in Japanese Patent Application Publication No. 2014-143244 includes a plurality of lifter pins for raising the target object from the mounting table. The lifter pins can protrude and retract with respect to a surface of the mounting table. The mounting table has holes for accommodating the lifter pins. The plasma processing apparatus disclosed in Japanese Patent Application Publication No. 2014-143244 has a gas hole for supplying a heat transfer gas such as He gas or the like to a space between a backside of the target object and a top surface of the electrostatic chuck.

The plasma processing apparatus disclosed in Japanese Patent Application Publication No. 2014-143244 has the lifter pins having inverted tapered upper end portions and pin through-holes having tapered upper end portions to prevent discharge occurrence between the target object and the mounting table. The upper end portions of the lifter pins are brought into surface contact with the upper end portions of the pin through-holes when the lifter pins are accommodated in the pin through-holes.

However, the configuration disclosed in Japanese Patent Application Publication No. 2014-143244 needs to be improved to prevent discharge from occurring at the gas hole. Therefore, in this technical field, there are required a mounting table capable of preventing abnormal discharge and a plasma processing apparatus including the mounting table.

SUMMARY OF THE INVENTION

In accordance with an aspect, there is provided a mounting table to which a voltage can be applied. The mounting table includes: an electrostatic chuck, a base, a spacer and a pin. The electrostatic chuck has a mounting surface for mounting a target object and a rear surface opposite to the mounting surface, and a first through-hole is formed in the mounting surface. The base is in contact with the rear surface of the electrostatic chuck and has a second through-hole communicating with the first through-hole. The spacer has a cylindrical shape, and is inserted in the second through-hole. The pin is accommodated in the first through-hole and the spacer. Gaps are formed between the pin and inner walls of the first through-hole and the spacer, and the gap between the first through-hole and the pin is greater than the gap between the spacer and the pin.

In the mounting table, the pin is accommodated in the first through-hole formed in the mounting surface and the spacer inserted in the second through-hole communicating with the first through-hole. Therefore, the space of the hole formed in the mounting table can be reduced not to provide a space for acceleration of electrons. Accordingly, it is possible to prevent discharge occurrence at the first through-hole and the spacer. Further, the discharge can be prevented without deteriorating the gas supply function because the gaps are formed between the pin and the inner walls of the first through-hole and the spacer. Moreover, when the electrostatic chuck and the base are formed of different materials, the contact point between the first through-hole and the spacer may be deviated due to the difference between the thermal expansion coefficients. In the mounting table described above, the gap between the pin and the first through-hole is greater than the gap between the pin and the spacer. Accordingly, even when the electrostatic chuck and the base are formed of different materials, it is possible to avoid the damage of the pin inserted in the first through-hole and the spacer. In addition, the present inventors have found that abnormal discharge can be effectively prevented when the space in the base is reduced compared with when the space in the electrostatic chuck is reduced. That is, by allowing the gap between the pin and the first through-hole to have the space enough to avoid the damage of the pin, the abnormal discharge can be effectively prevented while avoiding damage of the pin.

In accordance with another aspect, there is provided a mounting table to which a voltage can be applied. The mounting table includes: an electrostatic chuck, a base and a pin. The electrostatic chuck has a mounting surface for mounting a target object and a rear surface opposite to the mounting surface, and a first through-hole is formed in the mounting surface. The base is in contact with the rear surface of the electrostatic chuck, and has a second through-hole communicating with the first through-hole. The pin is accommodated in the first through-hole and the second through-hole. Gaps are formed between the pin and inner walls of the first through-hole and the second through-hole, and the gap between the first through-hole and the pin is greater than the gap between the second through-hole and the pin.

In such a mounting table, the pin is accommodated in the first through-hole formed in the mounting surface and the second through-hole communicating with the first through-hole. Therefore, the space of the hole formed in the mounting table can be reduced not to provide a space for acceleration of electrons. Accordingly, it is possible to prevent discharge occurrence at the first through-hole and the second through-hole. Further, the discharge can be prevented without deteriorating the gas supply function because the gaps are formed between the pin and the inner walls of the first through-hole and the second through-hole. Moreover, when the electrostatic chuck and the base are formed of different materials, the contact point between the first through-hole and the second through-hole may be deviated due to the difference between the thermal expansion coefficients. In the mounting table described above, the gap between the pin and the first through-hole is greater than the gap between the pin and the second through-hole. Accordingly, even when the electrostatic chuck and the base are formed of different materials, it is possible to avoid the damage of the pin inserted in the first through-hole and the second through-hole. In addition, the present inventors have found that abnormal discharge can be effectively prevented when the space in the base is reduced compared with when the space in the electrostatic chuck is reduced. That is, by allowing the gap between the pin and the first through-hole to have the space enough to avoid the damage of the pin, the abnormal discharge can be effectively prevented while avoiding damage of the pin.

In accordance with still another aspect, there is provided a plasma processing apparatus including: a processing chamber, a gas supply unit and a mounting table. The processing chamber defines a processing space where a plasma is generated. The gas supply unit is configured to supply a processing gas into the processing space. The mounting table is provided in the processing space and configured to mount thereon a target object. The mounting table includes an electrostatic chuck, a base, a spacer and a pin. The electrostatic chuck has a mounting surface for mounting a target object and a rear surface opposite to the mounting surface, and a first through-hole is formed in the mounting surface. The base is in contact with the rear surface of the electrostatic chuck and has a second through-hole communicating with the first through-hole. The spacer has a cylindrical shape, and is inserted in the second through-hole. The pin is accommodated in the first through-hole and the spacer. Gaps are formed between the pin and inner walls of the first through-hole and the spacer, and the gap between the first through-hole and the pin is greater than the gap between the spacer and the pin.

In accordance with still another aspect, there is provided a plasma processing apparatus including: a processing chamber, a gas supply unit and a mounting table. The processing chamber defines a processing space where a plasma is generated. The gas supply unit is configured to supply a processing gas into the processing space. The mounting table is provided in the processing space and configured to mount thereon a target object. The mounting table includes an electrostatic chuck, a base and a pin. The electrostatic chuck has a mounting surface for mounting a target object and a rear surface opposite to the mounting surface, and a first through-hole is formed in the mounting surface. The base is in contact with the rear surface of the electrostatic chuck, and has a second through-hole communicating with the first through-hole. The pin is accommodated in the first through-hole and the second through-hole. Gaps are formed between the pin and inner walls of the first through-hole and the second through-hole, and the gap between the first through-hole and the pin is greater than the gap between the second through-hole and the pin.

In accordance with various aspects and embodiments of the present disclosure, the mounting table and the plasma processing apparatus including the mounting table are capable of preventing abnormal discharge.

BRIEF DESCRIPTION OF THE DRAWINGS

The objects and features of the disclosure will become apparent from the following description of embodiments, given in conjunction with the accompanying drawings, in which:

FIGS. 6A to 6F explain abnormal discharge;

FIG. 7 is a schematic cross sectional view showing a configuration of a gas hole according to a second embodiment; and FIG. 8 is a table showing occurrence/non-occurrence of discharge in test examples and a comparative example.

DETAILED DESCRIPTION OF THE EMBODIMENTS

Figure 1:
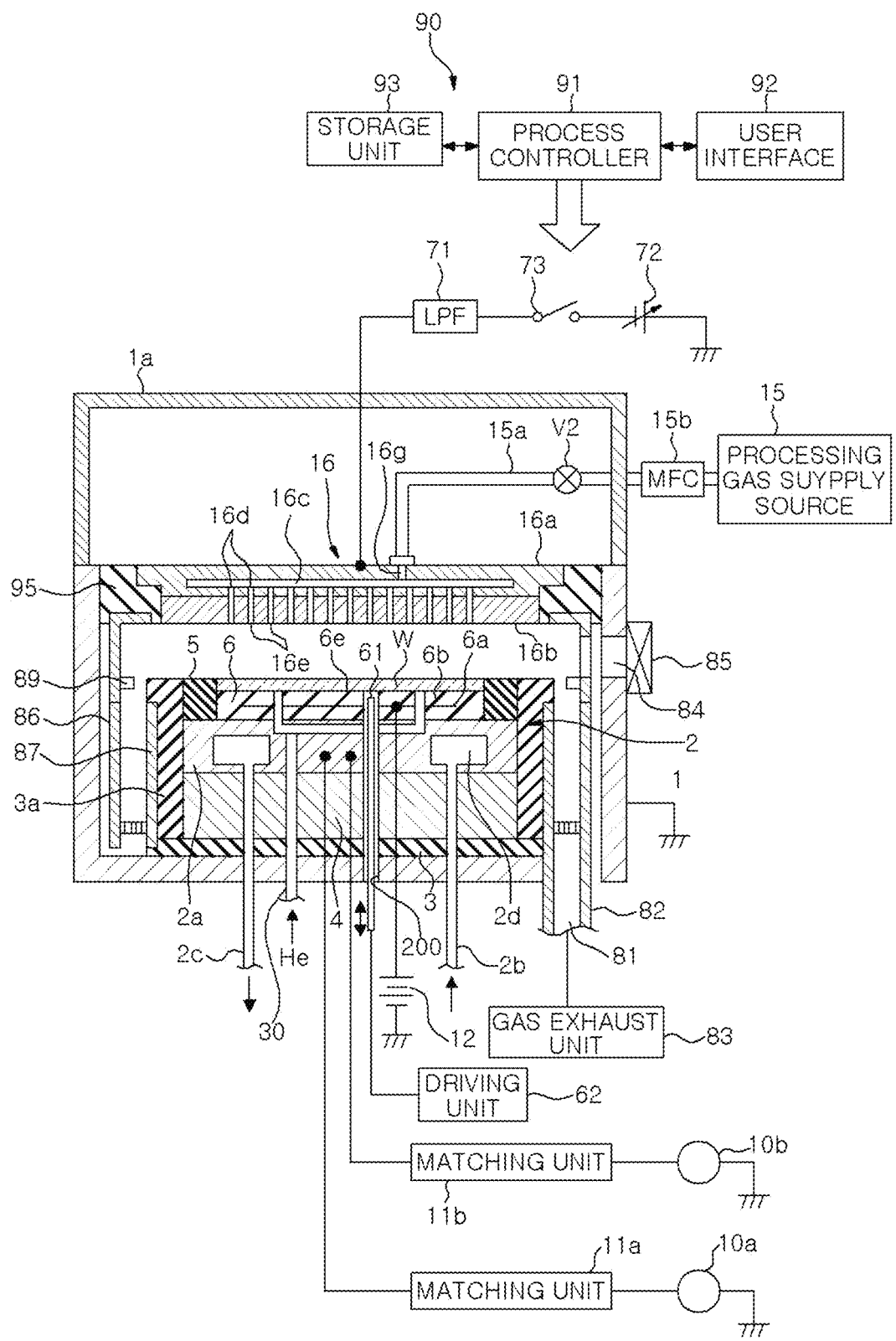
FIG. 1 is a schematic cross sectional view showing a configuration of a plasma processing apparatus according to a first embodiment.

Hereinafter, embodiments will be described in detail with reference to the accompanying drawings. Like reference numerals will be used for like or corresponding parts throughout the drawings. Terms "upper" and "lower" are used based on illustrated states, for convenience.

First Embodiment

FIG. 1 is a schematic cross sectional view showing a configuration of a plasma processing apparatus according to a first embodiment. The plasma processing apparatus includes a processing chamber 1 that is airtightly sealed and electrically connected to a ground potential. The processing chamber 1 is formed in a cylindrical shape and made of, e.g., aluminum or the like. The processing chamber 1 defines a processing space where a plasma is generated. A mounting table 2 for horizontally supporting a semiconductor wafer (hereinafter, simply referred to as "wafer") that is a target object is provided in the processing chamber 1. The mounting table 2 includes a base 2a and an electrostatic chuck 6. The base 2a is made of a conductive metal, e.g., aluminum or the like, and serves as a lower electrode. The electrostatic chuck 6 has a function of attracting and holding the wafer W. The mounting table 2 is supported by a conductive support 4 through an insulating plate 3. A focus ring 5 made of, e.g., single crystalline silicon, is provided on an outer periphery of the mounting table 2. A cylindrical inner wall member 3a made of, e.g., quartz or the like, surrounds outer peripheries of the mounting table 2 and the support 4.

The base 2a is connected to a first RF power supply 10a via a first matching unit 11a and connected to a second RF power supply 10b via a second matching unit 11b. The first RF power supply 10a is used for plasma generation and configured to supply a high frequency power having a predetermined high frequency to the base 2a of the mounting table 2. The second RF power supply 10b is used for ion attraction (bias) and configured to supply a high frequency power having a predetermined frequency lower than that of the first RF power supply 10a to the base 2a of the mounting table 2. In this manner, a voltage can be applied to the mounting table 2. A shower head 16 serving as an upper electrode is provided above the mounting table 2 to face the mounting table 2. The shower head 16 and the mounting table 2 function as a pair of electrodes (upper electrode and lower electrode).

The electrostatic chuck 6 has a configuration in which an electrode 6a is buried in an insulator 6b. A DC power supply 12 is connected to the electrode 6a. By applying a DC voltage from the DC power supply 12 to the electrode 6a, the wafer W is attracted by a Coulomb force. The insulator 6b is made of, e.g., ceramic or the like.

A coolant flow path 2d is formed in the mounting table 2. A coolant inlet line 2b and a coolant outlet line 2c are connected to the coolant flow path 2d. By circulating a coolant, e.g., cooling water, through the coolant flow path 2d, the mounting table 2 can be controlled to a predetermined temperature. A gas supply line 30 for supplying a cold heat transfer gas (backside gas) such as He gas or the like to the backside of the wafer W is formed through the mounting table 2 and the like. The gas supply line 30 is connected to a gas supply source (not shown). With this configuration, the wafer W attracted and held on the top surface of the mounting table 2 by the electrostatic chuck 6 is controlled to a predetermined temperature. A structure of the gas supply line 30 will be described later.

The mounting table 2 is provided with a plurality of, e.g., three pin through-holes 200 (only one shown in FIG. 1).

Lifter pins 61 are inserted into the respective pin through-holes 200. The lifter pins 61 are connected to a driving unit 62 and vertically moved by the driving unit 62. A structure of the pin through-holes 200 will be described later.

The shower head 16 is provided at a ceiling wall of the processing chamber 1. The shower head 16 includes a main body 16a and an upper ceiling plate 16b serving as an electrode plate. The shower head 16 is supported at an upper portion of the processing chamber 1 through an insulating member 95. The main body 16a is made of a conductive material, e.g., aluminum having an anodically oxidized surface and detachably holds the upper ceiling plate 16b therebelow.

A gas diffusion space 16c is provided in the main body 16a. A plurality of gas through-holes 16d is formed at a bottom portion of the main body 16a and positioned below the gas diffusion space 16c. Gas injection holes 16e are formed through the upper ceiling plate 16b in a thickness direction thereof and overlapped with the gas through-holes 16d. With this configuration, a processing gas supplied into the gas diffusion space 16c is distributed and supplied in a shower shape into the processing chamber 1 through the gas through-holes 16d and the gas injection holes 16e.

A gas inlet port 16g for introducing the processing gas into the gas diffusion space 16c is formed in the main body 16a. One end of a gas supply line 15a is connected to the gas inlet port 16g. The other end of the gas supply line 15a is connected to a processing gas supply source (gas supply unit) 15 for supplying a processing gas. A mass flow controller (MFC) 15b and an opening/closing valve V2 are installed in the gas supply line 15a in that order from an upstream side. The processing gas for plasma etching is supplied from the processing gas supply source 15 into the gas diffusion space 16c through the gas supply line 15a and then distributed and supplied in a shower shape from the gas diffusion space 16c into the processing chamber 1 through the gas through-holes 16d and the gas injection holes 16e.

A variable DC power supply 72 is electrically connected to the shower head 16 serving as the upper electrode via a low pass filter (LPF) 71. A power supply of the variable DC power supply 72 is on-off controlled by an on/off switch 73. Current/voltage of the variable DC power supply 72 and on/off of the on/off switch 73 are controlled by a control unit 90 to be described later. As will be described later, when a plasma is generated in the processing space by applying the high frequency power from the first and the second RF power supply 10a and 10b to the mounting table 2, the on/off switch 73 is turned on by the control unit 90 and a predetermined DC voltage is applied to the shower head 16 serving as the upper electrode, if necessary.

A cylindrical ground conductor 1a extends upward from a sidewall of the processing chamber 1 to a position higher than a height of the shower head 16. The cylindrical ground conductor 1a has a ceiling wall at the top thereof.

A gas exhaust port 81 is formed at a bottom portion of the processing chamber 1. A first gas exhaust unit 83 is connected to the gas exhaust port 81 via a gas exhaust line 82. The first gas exhaust unit 83 has a vacuum pump. By operating the vacuum pump, a pressure in the processing chamber 1 can be decreased to a predetermined vacuum level. A loading/unloading port 84 for the wafer W and a gate valve 85 for opening/closing the loading/unloading port 84 are provided at a sidewall of the processing chamber 1.

A deposition shield 86 is provided along an inner wall surface of the processing chamber 1. The deposition shield 86 prevents etching by-products (deposits) from being attached to the processing chamber 1. A conductive member (GND block) 89 is provided at a portion of the deposition shield 86 at the substantially same height as the height of the wafer W. The conductive member 89 is connected such that a potential with respect to the ground can be controlled. Due to the presence of the conductive member 89, abnormal discharge is prevented. A deposition shield 87 extending along the inner wall member 3a is provided at a lower side of the deposition shield 86. The deposition shields 86 and 87 are detachably provided.

The operation of the plasma processing apparatus configured as described above is integrally controlled by the control unit 90. The control unit 90 includes a process controller 91 having a CPU, a user interface 92, and a storage unit 93.

The user interface 92 includes a keyboard for a process manager to input commands to operate the plasma processing apparatus, a display for visualizing an operational status of the plasma processing apparatus, and the like.

The storage unit 93 stores therein recipes including a control program (software), processing condition data and the like for realizing various processes performed by the plasma processing apparatus under the control of the process controller 91. If necessary, any recipe is retrieved from the storage unit 93 in response to a command from the user interface 92 or the like and executed by the process controller 91. Accordingly, a desired process in the plasma processing apparatus is performed under the control of the process controller 91. Further, the recipes including the control program, the processing condition data and the like can be stored in a computer-readable storage medium (e.g., a hard disk, a CD, a flexible disk, a semiconductor memory, or the like) or can be transmitted, when needed, from another apparatus, via, e.g., a dedicated line, and used on-line.

Figure 2:
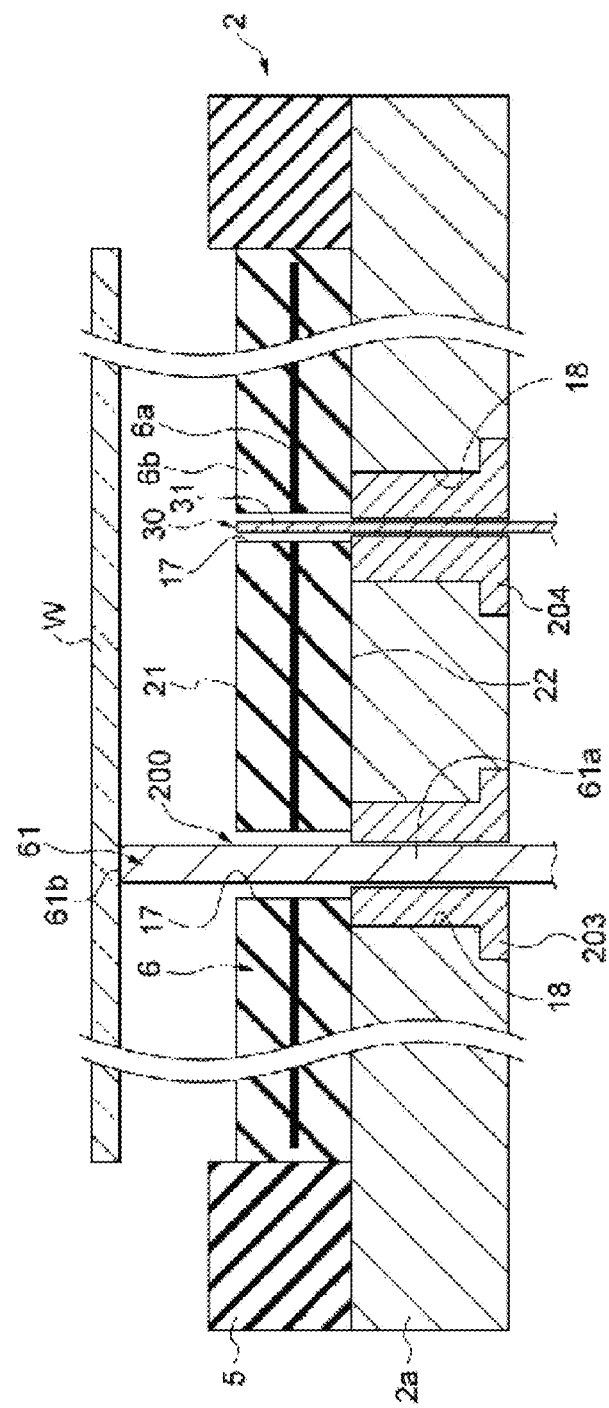
FIGS. 2 and 3 are schematic cross sectional views showing a mounting table in the plasma processing apparatus shown in FIG. 1.
Figure 3:
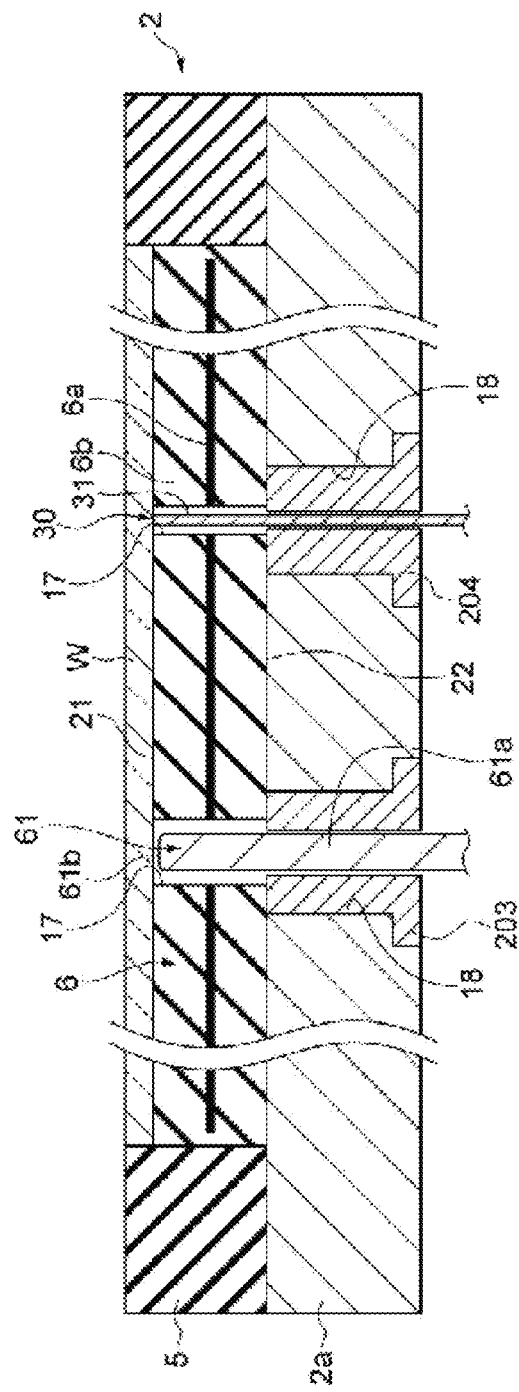

Hereinafter, a main configuration of the mounting table 2 will be described with reference to FIGS. 2 and 3. FIGS. 2 and 3 are schematic cross sectional views of the mounting table 2 in the plasma processing apparatus shown in FIG. 1. FIG. 2 shows a case in which the wafer W is raised and supported by the lifter pins 61. FIG. 3 shows a case in which the wafer W is supported on the electrostatic chuck 6 by lowering the lifter pins 61. As described above, the mounting table 2 includes the base 2a and the electrostatic chuck 6, and the lifter pins 61 can be inserted from a lower portion of the base 2a to protrude beyond the electrostatic chuck 6.

The electrostatic chuck 6 is formed in a disc shape and has a mounting surface 21 for mounting the wafer W thereon and a rear surface 22 opposite to the mounting surface 21. The mounting surface 21 has a circular shape and supports the disc-shaped wafer W while being in contact with the backside of the wafer W. The base 2a is in contact with the rear surface 22 of the electrostatic chuck 6. The electrostatic chuck 6 can be made to be in contact with the surface of the base 2a by using an adhesive.

An end portion (gas hole) of the gas supply line 30 is formed at the mounting surface 21. The gas supply line 30 supplies He gas for cooling or the like. The end portion of the gas supply line 30 is formed by a first through-hole 17 and a second through-hole 18. The first through-hole 17 extends from the rear surface 22 to the mounting surface 21 of the electrostatic chuck 6. In other words, the electrostatic chuck 6 defines an inner wall of the first through-hole 17. The second through-hole 18 extends from a rear surface of the base 2a to a contact surface with the electrostatic chuck 6. In other words, the base 2a defines an inner wall of the second through-hole 18. A diameter of the second through-hole 18 is greater than that of the first through-hole 17. The electrostatic chuck 6 and the base 2a are arranged such that the first through-hole 17 and the second through-hole 18 communicate with each other. A gas spacer 204 is provided at the gas supply line 30.

The gas spacer 204 is made of an insulator, e.g., ceramic or the like, and has a cylindrical shape. The gas spacer 204 has an outer diameter that is substantially equal to the diameter of the second through-hole 18 so that the gas spacer 204 can be in contact with the base 2a inside the second through-hole 18 and insertion-fitted into the second through-hole 18 from a bottom surface toward a top surface of the base 2a. The gas spacer 204 has an inner diameter smaller than the diameter of the first through-hole 17.

A pin 31 is accommodated in the gas hole. The pin 31 is accommodated in the first through-hole 17 and the gas spacer 204. An outer diameter of the pin 31 is smaller than the inner diameter of the gas spacer 204 and the inner diameter of the first through-hole 17. In other words, the gas spacer 204 has an inner diameter that is smaller than the diameter of the first through-hole 17 and greater than the outer diameter of the pin 31. The pin 31 may be made of an insulator, e.g., ceramic or the like.

The pin through-holes 200 for accommodating the respective lifter pins 61 are formed in the mounting surface 21. The first through-hole 17 and the second through-hole 18 form the pin through-hole 200. As described above, the first through-hole 17 is formed at the electrostatic chuck 6 and the second through-hole 18 is formed at the base 2a. The first through-hole 17 forming the pin through-hole 200 has a diameter slightly greater than the outer diameter of the lifter pin 61 (by, e.g., 0.1 mm to 0.5 mm) and, thus, the lifter pin 61 can be accommodated therein. The diameter of the second through-hole is greater than, e.g., the diameter of the first through-hole. A pin spacer 203 is provided between the inner wall of the second through-hole 18 and the lifter pin 61.

The pin spacer 203 is provided in the second through-hole 18 forming the pin through-hole 200. The pin spacer 203 is made of an insulator, e.g., ceramic or the like, and has a cylindrical shape. The pin spacer 203 has an outer diameter that is substantially equal to the diameter of the second through-hole 18 so that the pin spacer 203 can be in contact with the base 2a inside the second through-hole 18 and is insertion-fitted into the second through-hole 18 from the bottom surface toward the top surface of the base 2a. The pin spacer 203 has an inner diameter that is smaller than the diameter of the first through-hole 17 and greater than the outer diameter of the lifter pin 61.

The lifter pin 61 includes a pin-shaped pin main body 61a made of insulating ceramic or resin and an upper end portion 61b. The pin main body 61a is formed in a cylindrical shape and has an outer diameter of, e.g., a few mm. The upper end portion 61b is formed by chamfering the pin main body 61a and has a spherical surface. The spherical surface has, e.g., a considerably large curvature, and the entire pin upper end portion 61b of the lifter pin 61 is positioned close to the backside of the wafer W. The lifter pin 61 can vertically move through the pin through-hole 200 to protrude beyond and retreat below the mounting surface 21 of the mounting table 2 by the driving unit 62 shown in FIG. 1. The driving unit 62 adjusts a height of a stop position of the lifter pin 61 such that the pin upper end portion 61b of the lifter pin 61 is positioned right below the backside of the wafer W when the lifter pin 61 is accommodated.

As shown in FIG. 2, when the lifter pin 61 is raised, a part of the pin main body 61a and the pin upper end portion 61b protrude beyond the mounting surface 21 of the mounting table 2 and the wafer W is supported above the mounting table 2. As shown in FIG. 3, when the lifter pin 61 is lowered, the pin main body 61a is accommodated in the pin through-hole 200 and the wafer W is mounted on the mounting table 21. In this manner, the lifter pin 61 vertically moves the wafer W.

Figure 4:
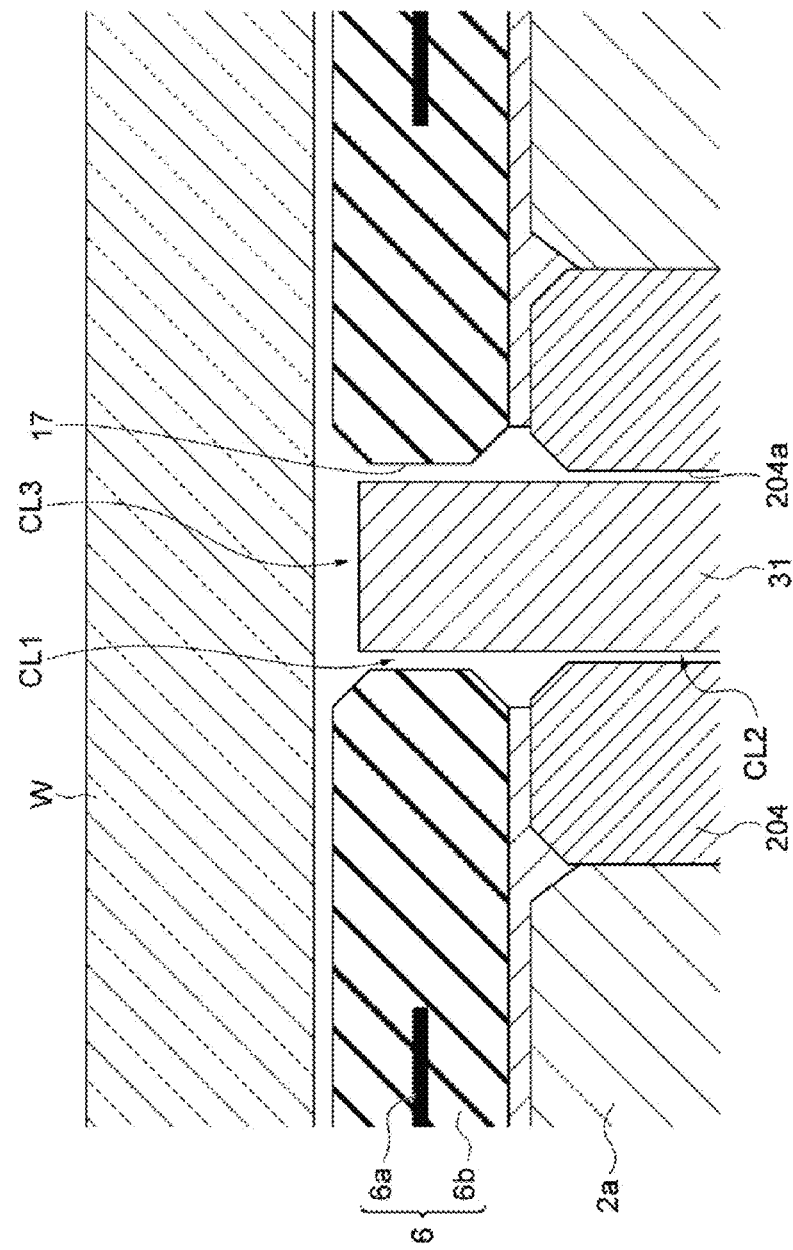
FIG. 4 is a schematic cross sectional view showing a configuration of a gas hole in the mounting table shown in FIGS. 2 and 3.

FIG. 4 is a schematic cross sectional view showing a configuration of the gas hole in the mounting table shown in FIGS. 2 and 3. As shown in FIG. 4, a gap CL1 is formed between a side portion of the pin 31 and the first through-hole 17; a gap CL2 is formed between the side portion of the pin 31 and an inner wall 204a of the spacer 204; and a gap CL3 is formed between the upper end of the pin 31 and the backside of the wafer W. The gap CL1 is greater than the gap CL2.

Figure 5:
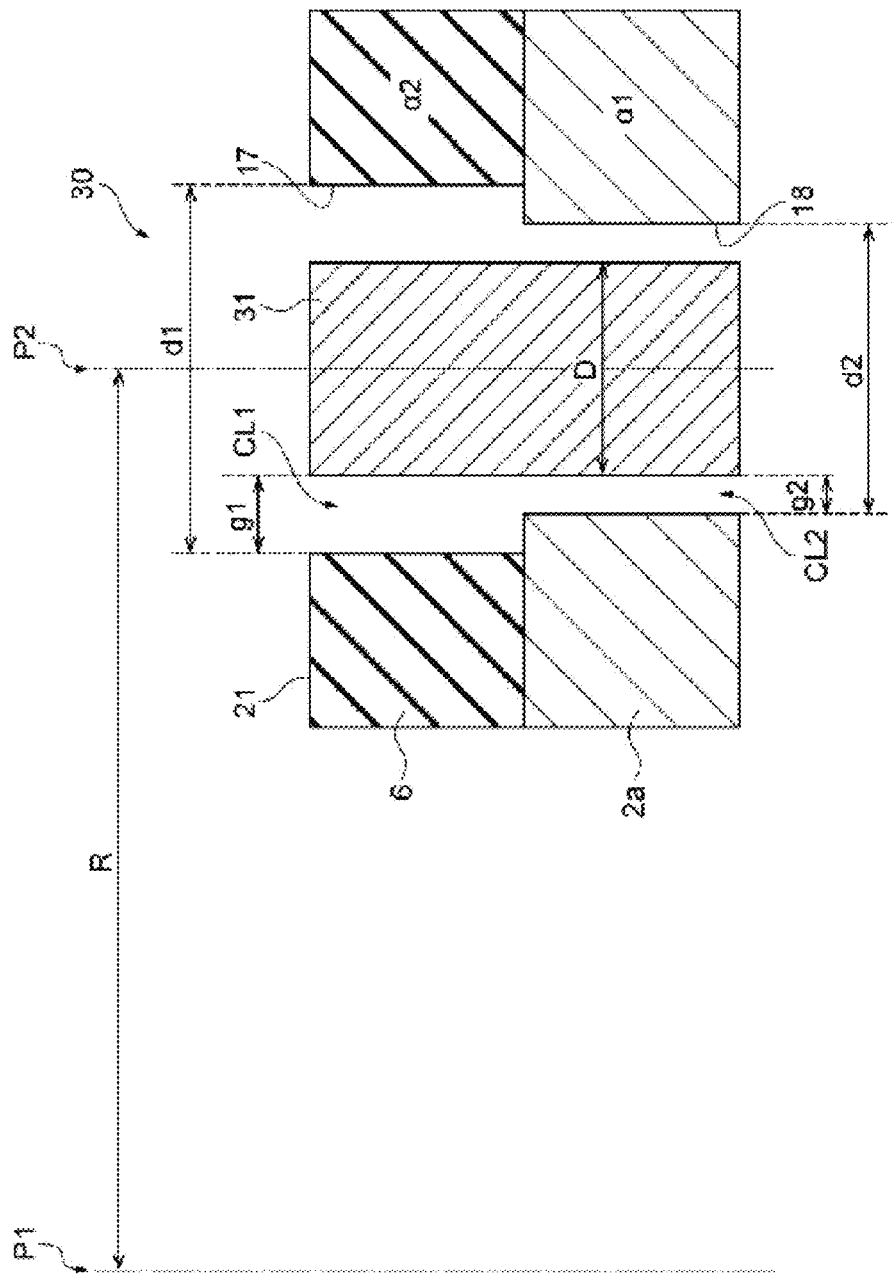
FIG. 5 explains positional relation of components defining the gas hole shown in FIG. 4.

FIG. 5 explains positional relation of components defining the gas hole of FIG. 4. As shown in FIG. 5, on the assumption that: the center of the mounting surface 21 is P1; the center of the gas hole is P2; a distance from the center P1 of the mounting surface 21 to the center of the first through-hole 17 (the center P2 of the gas hole) is R; a diameter of the pin 31 is D; a diameter of the first through-hole 17 is d1; a diameter of the second through-hole 18 is d2; a length of the gap CL1 in the first through-hole 17 is g1; a length of the gap in the second through-hole 18 is g2; a thermal expansion coefficient of the base 2a is α1; a thermal expansion coefficient of the electrostatic chuck 6 is α2; and a difference between a target temperature and a reference temperature that is a temperature measured when the first and the second through-hole 17 and 18 are coaxially disposed is ΔT, the length g1 of the gap CL1 in the first through-hole satisfies the following relation.

$$g1 \geq (2 \cdot (R \cdot (\alpha 1 - \alpha 2) \cdot \Delta T + D) - d2 - D)/2$$

In FIG. 5, the gas spacer 204 is omitted. When the gas spacer 204 is provided, the length g2 of the gap CL2 in the second through-hole 18 corresponds to a distance between an inner wall of the gas spacer 204 and the side portion of the pin 31. When the gas spacer 204 is not provided, the length g2 of the gap CL2 in the second through-hole 18 corresponds to a distance between the inner wall of the second through-hole 18 and the side portion of the pin 31.

Next, the effect of the gaps CL1 and CL2 on abnormal discharge will be explained. In order to prevent the abnormal discharge, it is important to remove a space where electrons are accelerated and, thus, it is required to minimize both of the gaps CL1 and CL2. However, when both of the gaps CL1 and CL2 are decreased, the pin 31 may be damaged due to the difference between thermal expansion coefficients of the base 2a and the electrostatic chuck 6. Therefore, in order to ensure a space, one of the gaps CL1 and CL2 needs to be set greater than the other.

FIGS. 6A to 6F explain the abnormal discharge. FIGS. 6A to 6C show a case in which the gap CL2 is greater than the gap CL1. FIGS. 6D to 6F show a case in which the gap CL1 is greater than the gap CL2. The gas spacer 204 is omitted in FIGS. 6A to 6F.

First, the case in which the gap CL2 is greater than the gap CL1 will be described. As shown in FIG. 6A, when the voltage is applied to the mounting table, an electric field is generated between a side portion 2ae of the base 2a (side portion of the gas spacer 204 when the gas spacer 204 is provided) which defines the gap CL2 and a corresponding portion WE in the backside of the wafer W. At this time, a space that is enough for acceleration of electrons exists, so that micro-hollow cathode discharge PL1 occurs in the gap CL2. Then, as shown in FIG. 6B, electrons are supplied from the gap CL2 to the gap CL1. Accordingly, as shown in FIG. 6C, glow discharge occurs at the backside of the wafer W. In other words, it is considered that when the gap CL2 is greater, abnormal discharge is caused by the micro-hollow cathode discharge.

Next, the case in which the gap CL1 is greater than the gap CL2 will be described. As shown in FIG. 6D, when the voltage is applied to the mounting table, an electric field is generated between the side portion 2ae of the base 2a (side portion of the gas spacer 204 when the gas spacer 204 is provided) which defines the gap CL2 and the corresponding portion WE in the backside of the wafer W. At this time, a space that is enough for acceleration of electrons does not exist, so that the micro-hollow cathode discharge PL1 does not occur in the gap CL2. Therefore, as shown in FIGS. 6E and 6F, glow discharge does not occur at the backside of the wafer W. In other words, it is considered that when the gap CL2 is smaller, the occurrence of abnormal discharge caused by the micro-hollow cathode discharge can be suppressed.

As described above, in the mounting table 2 and the plasma processing apparatus according to the first embodiment, the pin 31 is accommodated in the first through-hole 17 formed at the mounting surface 21 and the gas spacer 204 inserted in the second through-hole 18 communicating with the first through-hole 17. Therefore, the space of the hole formed in the mounting table 2 can be reduced not to provide a space for acceleration of electrons. Accordingly, it is possible to prevent discharge occurrence at the first through-hole 17 and the gas spacer 204. Further, the discharge can be prevented without deteriorating the gas supply function because the gaps are formed between the pin 31 and the inner walls of the first through-hole 17 and the gas spacer 204. When reducing either one of the gap CL1 or CL2 since it is not possible to reduce both of the gaps CL1 and CL2, the gap CL2 that is effective in suppressing the occurrence of abnormal discharge is reduced. Accordingly, the abnormal discharge can be effectively prevented while avoiding damage of the pin 31.

Second Embodiment

A mounting table and a plasma processing apparatus according to a second embodiment are the same as the mounting table and the plasma processing apparatus according to the first embodiment except that the pin spacer 203 and the gas spacer 204 are not provided. Hereinafter, redundant description will be omitted and differences will be described mainly.

FIG. 7 is a schematic cross sectional view showing a configuration of the gas hole in the mounting table. As shown in FIG. 7, a gap CL1 is formed between the side portion of the pin 31 and the first through-hole 17; a gap CL2 is formed between the side portion of the pin 31 and the second through-hole 18; and a gap CL3 is formed between the upper end of the pin 31 and the backside of the wafer W. The gap CL1 is greater than the gap CL2. The other configurations of the mounting table are the same as those in the first embodiment.

In the mounting table 2 and the plasma processing apparatus according to the second embodiment, the pin 31 is accommodated in the first through-hole 17 formed in the mounting surface 21 and the second through-hole 18 communicating with the first through-hole 17. Therefore, the space of the hole formed in the mounting table 2 can be reduced not to provide a space for acceleration of electrons. Accordingly, it is possible to prevent the discharge occurrence at the first and the second through-hole 17 and 18. Further, the discharge can be prevented without deteriorating the gas supply function because the gaps are formed between the pin 31 and the inner walls of the first and the second through-hole 17 and 18. When reducing either one of the gap CL1 or CL2 since it is not possible to reduce both of the gaps CL1 and CL2, the gap CL2 that is effective in suppressing the occurrence of abnormal discharge is reduced. Accordingly, the abnormal discharge can be effectively prevented while avoiding damage of the pin 31.

While the embodiments have been described, the present disclosure is not limited to the above-described embodiments and may be variously modified or changed within the scope of the present disclosure as defined in the claims.

For example, in FIG. 4, the gap CL1 is made to be greater than the gap CL2 by setting the diameter of the first through-hole 17 to be greater than the inner diameter of the gas spacer 204. However, the gap CL1 may be made to be greater than the gap CL2 by changing the shape of the pin 31. In the same manner, in FIG. 7, the gap CL1 is made to be greater than the gap CL2 by setting the diameter of the first through-hole 17 to be greater than the inner diameter of the gas spacer 204. However, the gap CL1 may be made to be greater than the gap CL2 by changing the shape of the pin 31.

In the above-described embodiments, the pin 31 may be a lifter pin.

In the first and the second embodiment, the plasma processing apparatus may use a plasma generated by a radial line slot antenna.

TEST EXAMPLES

Hereinafter, test examples and a comparative example that have been performed by the present inventors to explain the above effects will be described.

Test Example 1

The plasma processing apparatus according to the first embodiment was used. The wafer W was mounted on the mounting table 2. A plasma was generated by applying a voltage to the mounting table 2 (first RF power supply 10a: 2700 W, second RF power supply 10b: 19000 W, pressure: 30 Torr ($3.9 \times 10^3$ Pa)). He gas was used as a heat transfer gas. The gap CL1 was set to 0.15 mm. The gap CL2 was set to 0.05 mm. The gap CL3 was set to 0.2 mm. The plasma processing was performed for a predetermined period of time. Then, it was checked whether or not a discharge mark was formed on the backside of the wafer W.

Test Example 2

The gap CL3 was set to 0.3 mm. The other conditions were the same as those in the test example 1.

Comparative Example

The plasma processing apparatus according to the first embodiment was used. A wafer W was mounted on the mounting table 2. A plasma was generated by applying a voltage to the mounting table 2. The gap CL1 was set to 0.035 mm. The gap CL2 was set to 0.2 mm. The gap CL3 was set to substantially 0 mm. The plasma processing was performed for a predetermined period of time. Then, it was checked whether or not a discharge mark was formed on the backside of the wafer W. The processing conditions were the same as those in the test example 1.

A result thereof is shown in FIG. 8. As can be seen from FIG. 8, in the comparative example 1 (gap CL1<gap CL2), the abnormal discharge occurred on the backside of the wafer W. On the other hand, in the test examples 1 and 2 (gap CL1>gap CL2), the abnormal discharge did not occur on the backside of the wafer W. This indicates that the occurrence of the abnormal discharge can be effectively prevented by setting the gap CL2 to be smaller than the gap CL1.

While the disclosure has been shown and described with respect to the embodiments, it will be understood by those skilled in the art that various changes and modifications may be made without departing from the scope of the disclosure as defined in the following claims.

What is claimed is:

1. A mounting table for use in a plasma processing apparatus, the mounting table comprising:
   a conductive base having a base through-hole;
   an insulating spacer disposed in the base through-hole and extending substantially an entire height of the base through-hole, the insulating spacer having a spacer through-hole having a uniform diameter;
   an electrostatic chuck disposed on the conductive base, the electrostatic chuck having:
      an insulator;
      an electrode buried in the insulator; and
      a chuck through-hole in communication with the spacer through-hole, the chuck through-hole being defined by a vertical wall; and
   a pin disposed in the chuck through-hole and the spacer through hole, a first gap is defined between the pin and the chuck through-hole, a second gap is defined between the pin and the spacer through-hole, the first gap is greater than the second gap,
   wherein:
      the electrostatic chuck is formed in a disc shape,
      the insulating spacer is disposed directly between the conductive base and the second gap,
      the insulating spacer having a same height as the conductive base in a vertical direction,
      an entirety of the electrostatic chuck is disposed on the conductive base,
      a length g1 of the first gap satisfies the following equation:

$g1 \geq (2 \cdot (R \cdot (\alpha1 - \alpha2) \cdot \Delta T + D) - d2 - D)/2$, with D representing the diameter of the pin, R is a distance from a center of the mounting table to a center of the chuck through-hole, d2 representing the diameter of the spacer through-hole, α1 representing a thermal expansion coefficient of the conductive base, α2 representing a thermal expansion coefficient of the electrostatic chuck and ΔT representing a difference between a target temperature used during processing and a reference temperature measured when the chuck through-hole and the spacer through-hole are coaxially disposed, ΔT being a positive number,
the first gap is uniform along an entire height of the first gap,
the second gap extends from the first gap, and
the first gap is approximately 0.15 mm, and the second gap is approximately 0.05 mm.

2. The mounting table of claim 1, wherein the chuck through-hole has a first diameter at a first end and a second diameter at a second end, the first diameter is equal to the second diameter.

3. The mounting table of claim 2, wherein the base through-hole has a diameter greater than the first diameter and the second diameter, the spacer through-hole has a diameter smaller than the first diameter and the second diameter.

4. The mounting table of claim 1, wherein a third gap is defined between an upper end of the pin and a wafer placed on the electrostatic chuck.

5. The mounting table of claim 4, wherein the third gap is approximately 0.2-0.3 mm.

6. The mounting table of claim 5, wherein the spacer through-hole and the chuck through-hole are a gas supply line for supplying a heat transfer gas to a wafer placed on the electrostatic chuck, and the pin is fixed.

7. The mounting table of claim 5, wherein the pin is a lifter pin movable between an upper position and a lower position, and the third gap is formed when the lifter pin is at the lower position.

8. The mounting table of claim 1, wherein a third gap is defined between an upper end of the pin and a wafer placed on the electrostatic chuck, and
   wherein the third gap is approximately 0.2-0.3 mm.

9. The mounting table of claim 1, wherein the pin includes a chamfered upper end portion.

10. The mounting table of claim 9, wherein the insulating spacer has two chamfered side portions.

11. A mounting table for use in a plasma processing apparatus, the mounting table comprising:
    a conductive base having first and second base through-holes;
    a first insulating spacer disposed in the first base through-hole and extending substantially an entire height of the base through-hole, the first insulating spacer having a first spacer through-hole having a uniform diameter;
    a second insulating spacer disposed in the second base through-hole, the second insulating spacer having a second spacer through-hole, the second spacer through-hole having a uniform diameter,
    wherein the first and second insulating spacers have a same height as the conductive base;
    an electrostatic chuck disposed on the conductive base, the electrostatic chuck having:
       an insulator;
       an electrode buried in the insulator; and first and second chuck through-holes, the first chuck through-hole being in communication with the first spacer through-hole, the second chuck through-hole being in communication with the second spacer through-hole, each of the first and second chuck through-holes being defined by a vertical wall; and a fixed pin disposed in the first chuck through-hole and the first spacer through-hole, a first gap is defined between the fixed pin and the first chuck through-hole, a second gap is defined between the fixed pin and the first spacer through-hole, the first gap is greater than the second gap; and a lifter pin disposed in the second spacer through-hole and the second chuck through-hole, a third gap is defined between the lifter pin and the second chuck through-hole, a fourth gap is defined between the lifter pin and the second spacer through-hole, the third gap is greater than the fourth gap, wherein:
the electrostatic chuck is formed in a disc shape,
the first insulating spacer is disposed directly between the conductive base and the second gap,
the first and second insulating spacers each having a same height as the conductive base in a vertical direction,
an entirety of the electrostatic chuck is disposed on the conductive base,
a length g1 of the first gap satisfies the following equation:

$$g1 \geq (2 \cdot (R \cdot (\alpha 1 - \alpha 2) \cdot \Delta T + D) - d2 - D)/2,$$

with D representing the diameter of the pin, R is a distance from a center of the mounting table to a center of the chuck through-hole, d2 representing the diameter of the spacer through-hole, $\alpha 1$ representing a thermal expansion coefficient of the conductive base, $\alpha 2$ representing a thermal expansion coefficient of the electrostatic chuck and $\Delta T$ representing a difference between a target temperature used during processing and a reference temperature measured when the first chuck through-hole and the first spacer through-hole are coaxially disposed, $\Delta T$ being a positive number, the first gap is uniform along an entire height of the first gap, and the second gap extends from the first gap.

12. The mounting table of claim 11, wherein a fifth gap is defined between an upper end of the lifter pin and a wafer placed on the electrostatic chuck, and wherein the fifth gap is approximately 0.2-0.3 mm.

13. The mounting table of claim 11, wherein the lifter pin includes a chamfered upper end portion.

14. The mounting table of claim 13, wherein the first insulating spacer or the second insulating spacer has a chamfered side portion.

* * * * *